US012768912B2

(12) United States Patent
Mohtashami et al.

(10) Patent No.: US 12,768,912 B2
(45) Date of Patent: Oct. 20, 2026

(54) METROLOGY DEVICE AND METHOD

(71) Applicant: Nederlandse Organisatie voor toegepast-natuurwetenschappelijk onderzoek TNO, 's-Gravenhage (NL)

(72) Inventors: Abbas Mohtashami, 's-Gravenhage (NL); Clara Inés Osorio Tamayo, Delft (NL); Kodai Hatakeyama, Pijnacker (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 75 days.

(21) Appl. No.: 18/698,943

(22) PCT Filed: Oct. 7, 2022

(86) PCT No.: PCT/NL2022/050564
§ 371 (c)(1),
(2) Date: Apr. 5, 2024

(87) PCT Pub. No.: WO2023/059192
PCT Pub. Date: Apr. 13, 2023

(65) Prior Publication Data
US 2024/0410962 A1 Dec. 12, 2024

(30) Foreign Application Priority Data
Oct. 8, 2021 (EP) .................................... 21201626

(51) Int. Cl.
*G01R 33/032* (2006.01)
*G01B 7/26* (2006.01)
(Continued)

(52) U.S. Cl.
CPC ............. *G01R 33/032* (2013.01); *G01B 7/26* (2013.01); *G01Q 60/54* (2013.01); *G01Q 70/14* (2013.01); *G01R 33/26* (2013.01); *G01R 33/448* (2013.01)

(58) Field of Classification Search
CPC .. G01R 33/032; G01R 33/12; G01R 33/1284; G01R 33/26; G01R 33/448;
(Continued)

(56) References Cited

U.S. PATENT DOCUMENTS

| | | | | |
|---|---|---|---|---|
| 3,588,681 A * | 6/1971 | Murray | G01R 33/14 324/212 |
| 7,608,820 B1 * | 10/2009 | Berman | G01Q 20/02 250/306 |

(Continued)

FOREIGN PATENT DOCUMENTS

| | | |
|---|---|---|
| CN | 109001493 B | 8/2020 |
| EP | 3376245 A | 9/2018 |
| WO | 2014051886 A1 | 4/2014 |

OTHER PUBLICATIONS

European Patent Office, International Search Report in corresponding International Application No. PCT/NL2022/050564 dated Jan. 12, 2023.

*Primary Examiner* — Christopher P Mcandrew
(74) *Attorney, Agent, or Firm* — Leydig, Voit & Mayer, Ltd.

(57) ABSTRACT

A metrology device for determining metrological characteristics of a sample is described that includes a probe, a scanning mechanism, a radiation source, an optical sensor and a signal processor. In operation the scanning mechanism displaces the probe relative to the sample, along a surface of the sample. The probe has a diamond tip with one or more nitrogen-vacancy centers and is irradiated by the radiation source with photon radiation to excite the diamond tip to
(Continued)

emit fluorescent light. The optical sensor provides a sense signal indicative of an intensity of the emitted fluorescent light and the signal processor processes the sense signal to compute at least one characteristic of a feature present in the sample.

18 Claims, 13 Drawing Sheets

(51) Int. Cl.

| | |
|---|---|
| ***G01Q 60/54*** | (2010.01) |
| ***G01Q 70/14*** | (2010.01) |
| ***G01R 33/26*** | (2006.01) |
| ***G01R 33/44*** | (2006.01) |

(58) Field of Classification Search
CPC ...... G01R 33/0029; G01B 7/26; G01Q 60/54; G01Q 70/14; G01Q 60/52
USPC ...................................................... 324/244.1
See application file for complete search history.

(56) References Cited

U.S. PATENT DOCUMENTS

| | | | | |
|---|---|---|---|---|
| 10,338,261 | B2 * | 7/2019 | Gann | G01V 3/165 |
| 11,762,046 | B2 * | 9/2023 | Niu | G01Q 30/025 324/304 |
| 2008/0173812 | A1 | 7/2008 | Berman et al. | |
| 2016/0208763 | A1 * | 7/2016 | Fernandez | G01P 3/487 |
| 2016/0282427 | A1 * | 9/2016 | Heidmann | G11B 5/012 |
| 2017/0343695 | A1 * | 11/2017 | Stetson | G01V 3/101 |
| 2020/0386832 | A1 * | 12/2020 | Niu | G01Q 30/025 |

* cited by examiner

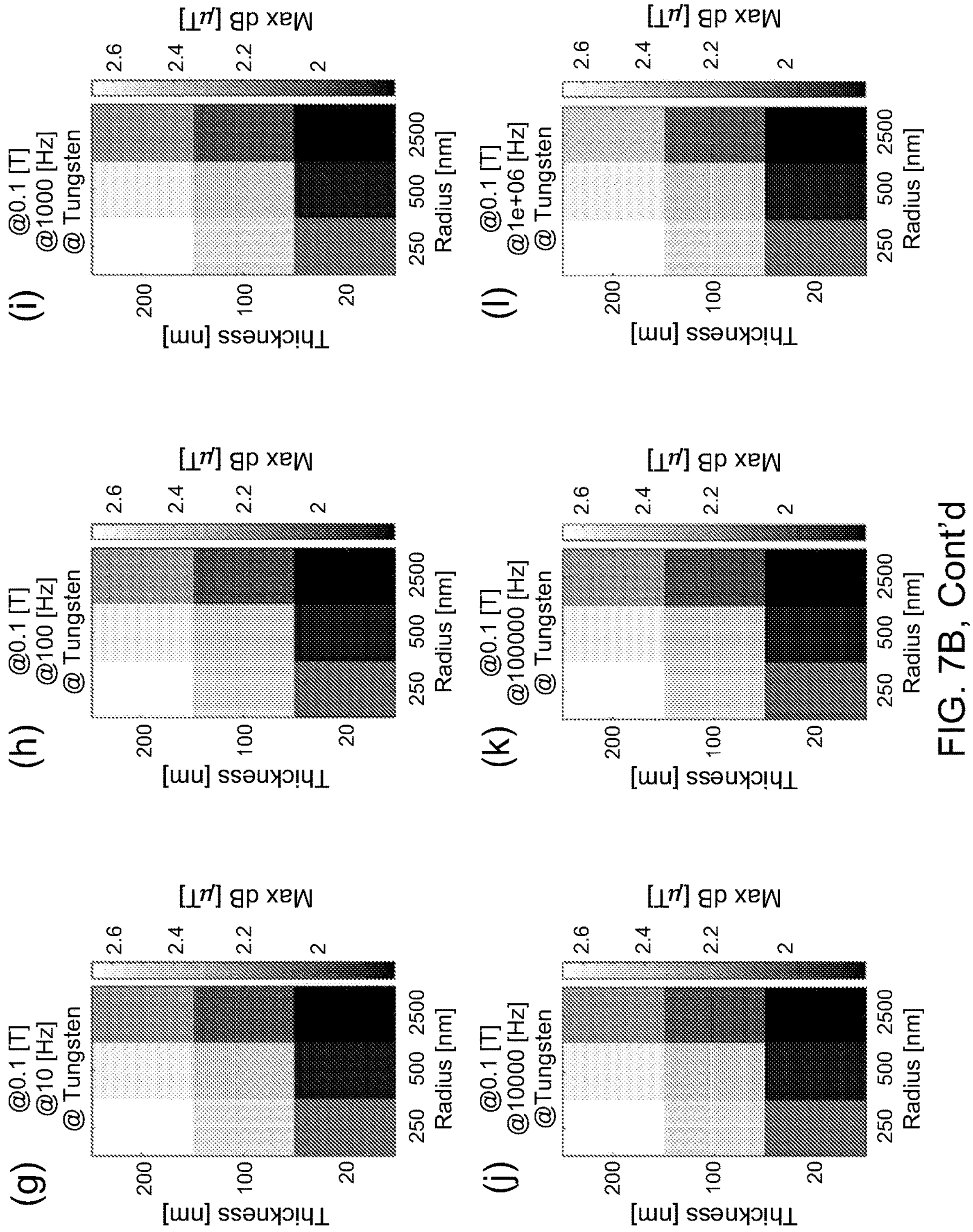
FIG. 7B, Cont'd

METROLOGY DEVICE AND METHOD

CROSS-REFERENCE TO RELATED APPLICATIONS

This patent application is a U.S. National Phase of PCT International Application No. PCT/NL2022/050564, filed Oct. 7, 2022, which claims priority to European Application No. 21201626.5, filed Oct. 8, 2021, which are both expressly incorporated by reference in their entireties, including any references contained therein.

BACKGROUND

The present disclosure pertains to a metrology device for determining metrological characteristics of a sample, with conductive features embedded in a layer of a material or a combination of materials having a conductivity different from that of the conductive features.

The present disclosure pertains to a method for determining metrological characteristics of a sample with conductive features embedded in a layer of a material or a combination of materials having a conductivity different from that of the conductive features.

For manufacturing integrated circuits a proper metrology of electrically conductive features is of ever increasing importance. Non-limiting examples of target metrology are measurement of buried electrically conductive features and subsurface material characterization. The first example may comprise a measurement of a (buried) metal layer thickness or a measurement of a height of an electrically conductive feature that is buried under a conductive layer, such as a fin height under a W or Co layer. This type of analysis also serves for defect detection in metallic layers and interconnects. The feature to be detected in that case is a defect or a void in an electrically conductive feature. In another example metrology is required for metal filled vias, BEOL interconnects, metal gates, metal lines, and the like. A still further example is hybrid CD-metrology for GAA and 3D NAND devices. Also it is desirable to identify material characteristics, so as the facilitate metrology analysis.

In particular, metrology for the next generation of the semiconductor devices like finFETs, GAAs, and 3D NANDs that incorporate complex device structures and new materials is currently one of the biggest challenges for the semiconductor industry.

The current e-beam based metrology solutions like CD-SEM are regarded damaging and have limitations for metrology in vertical dimensions (height/depth).

In some cases subsurface scanning probe microscopy (SSPM) is suitable as an alternative/complementary non-destructive technique to determine both lateral and vertical dimensions. However SSPM is not applicable when the mechanical properties (visco-elasticity or density) of the features to be measured are comparable with that of the substrate of the sample and/or neighboring features.

Accordingly, there is a need for a non-destructive device and method to measure and characterize for samples as specified above, for applications wherein SSPM is not applicable.

Reference is made to the following prior art.

CN 109 001 493 B relates to a high-precision magnetic detection microscopic device with integration of diamond nitrogen vacancy scanning and an AFM. This prior art is however silent about measurement of metrological characteristics of samples as specified above. Paragraph 60 merely mentions: "the fluorescence collecting mirror 4-8, and the photodetector 4-12 and photon counter 4-11 detect and calculate the magnetic information of the sample."

US 2008/173812 A1 relates to a scanning magnetic microscope, for characterizing a sample of dilute paramagnetic particles, which has a photoluminescent nanoprobe implanted in the tip apex of an atomic force microscope (AFM), a scanning tunneling microscope (STM) or a near-field scanning optical microscope (NSOM) and exhibits optically detected magnetic resonance (ODMR) in the vicinity of impaired electron spins or nuclear magnetic moments in the sample material. The described spin microscope is said to have demonstrated nanoscale lateral resolution and single spin sensitivity for the AFM and STM embodiments.

WO 2014/051886 A1 discloses a sensing probe for magnetic media formed of a diamond material comprising one or more spin defects that are configured to emit fluorescent light and are located no more than 50 nm from a sensing surface of the sensing probe. The sensing probe includes an optical outcoupling structure formed by the diamond material and configured to optically guide the fluorescent light toward an output end of the optical outcoupling structure. An optical detector detects the fluorescent light that is emitted from the spin defects and that exits through the output end of the optical outcoupling structure after being optically guided therethrough. A mounting system holds the sensing probe and controls a distance between the sensing surface of the sensing probe and a surface of a sample while permitting relative motion between the sensing surface and the sample surface.

US 2016/282427 A1 discloses a diamond probe that is suitable to be attached to an Atomic Force Microscope and that is created with a tip that incorporates one or more Nitrogen Vacancy (NV) centers located near the end of the tip and with which an electrically charged sample, such as a field effect transistor or flash memory, is to be scanned. The probe arm acts as an optical waveguide to propagate the emission from the NV center with high efficiency and a beveled end directs excitation light to the NV center and directs photoluminescence light emanating from the NV center into the probe arm.

EP 3 376 245 A1 pertains to a sensor device that comprises a carrier, a force feedback sensor, and a probe containing a spin defect. The probe is connected to the force feedback sensor either directly or indirectly via a handle structure. In order to couple the spin defect to a microwave field in an efficient and robust manner, the sensor device comprises an integrated microwave antenna arranged at a distance of less than 500 micrometers from the spin defect. The sensor device can be configured as a self-contained exchangeable cartridge that can easily be mounted in a sensor mount of a scanning probe microscope.

SUMMARY

According to one aspect of the disclosure, a metrology device is provided herein for determining metrological characteristics of a sample with conductive features embedded in a layer of a material or a combination of materials having a conductivity different from that of the conductive features. The metrology device comprises:

- a probe having a diamond tip with one or more nitrogen-vacancy (NV) centers;
- a scanning mechanism configured to displace the probe relative to the sample, along a surface of the sample;
- a scanning probe microscope (SPM) controller configured to position the probe in a direction transverse to the sample;

a radiation source to irradiate the tip with photon radiation to excite the tip to emit fluorescent light;

an optical sensor to provide a sense signal (Sil) indicative of an intensity of the emitted fluorescent light;

a signal processor to process the sense signal to compute at least one characteristic of a conductive feature present in the sample.

In operation the scanning mechanism displaces the probe relative to the sample along a surface of the sample. The SPM controller therewith controls a position of the probe in a direction transverse to the sample. In one embodiment the SPM controller is configured to maintain a contact mode of operation, wherein the probe is held in continuous contact with the sample surface during scanning. In an example thereof, the probe is provided as a cantilever. Typically therewith a deflection of an optical beam by the cantilever is used to provide a feedback signal with which the probe is maintained in contact with the sample.

In another embodiment the SPM controller is configured to maintain the probe close to the surface without contacting the surface. In an example of the second embodiment the probe is provided as a tuning fork, and a shear-force based feedback mechanism is used to maintain the probe close to the sample. An advantage of this embodiment is its simplicity as additional hardware components are avoided. In case the probe is provided as a cantilever, typically additional components are required, to enable z-position feedback, for example a light source directing a beam at the cantilever and an extra quad detector to sense a deflection of the beam by the cantilever. An advantage of this latter embodiment is its suitability for combination with other SPM cantilever-based metrology tools (like a subsurface SPM tool).

During scanning, the radiation source emits radiation to excite the tip to emit fluorescent light and in response thereto the optical sensor provides a sense signal indicative of an intensity of the emitted fluorescent light. The signal processor processes the sense signal to compute one more characteristics of a feature present in the sample. As set out in more detail hereinafter, the fluorescent response of the tip is affected by magnetic fields at the position of the tip. Therewith the signal processor computes characteristics of a feature at the location of the sample, such as its lateral dimensions, its thickness, a depth, a conductivity.

The small dimensions of the diamond tip, i.e. typically in the order of magnitude of about 10 nm to a few hundred nm already enable a highly accurate determination of feature positions in the sample. A further improvement of the positional accuracy is achieved in an embodiment of the sample characterization device wherein the diamond tip has a single NV center, which acts as an atom-sized probe.

In one embodiment the metrology device comprises a microwave antenna arranged near the tip and a microwave signal generator to supply the microwave antenna with a microwave signal. In one mode of operation the microwave signal generator is a sweeping microwave signal generator that is configured to supply the microwave antenna with a microwave signal of varying frequency. In that mode of operation it is detected at which frequency or pair of frequencies a reduction of a fluorescent response of the NV center occurs, which is indicative for a local magnitude of a magnetic field.

In another mode of operation of this embodiment the metrology device is used to determine a spin relaxation time T1. A value of the measured spin relaxation time T1 is indicative for a thickness and/or depth of electrically conductive features in the sample. In addition, changes in the value of T1 during scanning in a lateral direction indicate a lateral dimension of the features.

In another embodiment the metrology device alternatively or additionally comprises a magnetic coil and a current generator to supply the magnetic coil with a supply-current to induce a magnetic field in the sample. In case the supply current supplied in operation is an AC-current or comprises an AC-current component then an AC-magnetic field is generated by the magnetic coil that induces Eddy currents in electrically conductive features in the sample. The induced Eddy current in an electrically conductive feature induces a secondary magnetic field, which is detectable by the NV-center, so that a position or the dimensions of the feature can be determined from the secondary magnetic field as detected by the NV-center. In some examples, the metrology device further comprises a permanent magnet to provide a background magnetic field in the tip. Therewith the sensitivity and robustness of the metrology device is significantly increased. In some examples the metrology device further comprises a frequency control unit to control an operational frequency of the current generator. In one example thereof the frequency control unit is configured to subsequently select mutually different operational frequencies or to perform a frequency sweep. Low frequency magnetic fields tend to penetrate further into the sample than high frequency magnetic fields. Hence, when performing the Eddy current based measurements at mutually different frequencies at or near a same location mutually independent measurement results can be obtained that enable detecting mutually different features at mutually different depths at a same lateral position. In an alternative embodiment, the current generator generates a supply current having at least a first component and a second component of mutually different frequency. The composite response signal can be split into respective response signal components for mutually different frequency ranges, for example using a low-pass filter and a high pass filter.

In an embodiment the signal processor comprises signal processor components to determine respective changes in a magnetic field for a lateral position near the surface of the sample resulting from a source magnetic field for respective mutually different magnetic field frequencies, and to determine material properties of a material at that lateral position in the sample from the determined changes. The signal processor components for example comprise a signal processor component to decompose the response signal into two or more components, for example a component comprising a low-pass filter and a high-pass filter. Optionally the component to decompose the response signal into a plurality of components also comprises one or more band filters to select components of the response signal in respective frequency components. Further signal processor components are provided therewith to determine a magnitude of respective ones of the components therewith providing an indication of the change of the magnetic field associated with properties of the material in the sample, such as its relative magnetic permeability and its conductivity. Still further a signal analysis component may be provided that compares the indicated change magnitudes to identify the nature of the material in the sample near the sensed position.

According to a second aspect of the present disclosure a method is provided for determining metrological characteristics of a sample with conductive features embedded in a layer of a material or a combination of materials having a conductivity different from that of the conductive features, is provided. The method comprises:

carrying the sample displacing a probe relative to the sample, along a surface of the sample, the probe having a diamond tip with one or more nitrogen-vacancy (NV) centers;

irradiating the tip with photon radiation to excite the tip to emit fluorescent light;

optically sensing the tip and providing a sense signal indicative of an intensity of the fluorescent light emitted by the tip;

processing the sense signal to compute at least one characteristic of a feature present in the sample and characterized by:

subjecting the sample to a source magnetic field with at least a first frequency and a second frequency, which are mutually different;

analyzing the sensed signals for each of said at least a first frequency and a second frequency to identify features in the sample with mutually different conductivity properties, for example for metrology to measure the dimensions of the features and/or to identify their material properties near the diamond tip.

The sensed signals are indicative for an extent to which the magnetic field near the surface of the sample is changed due to material properties. For the currently investigated materials it appears that at relatively low frequencies, dependent on the conductivity, e.g. for copper in the range of 0 to 1 kHz, the change in magnetic field is mainly determined by the relative magnetic permeability of the material present at that position. For relatively high frequencies, e.g. in the case of copper about 100 MHz the effect of Eddy currents in the material becomes more relevant. The contribution thereof depends on the conductivity of the material. Using a single frequency, it is possible to determine both vertical and lateral dimensions of a feature in a sample. Therewith an alternative is provided for relaxometry measurements. Using two frequencies, e.g. a first frequency of at most 10 kHz and a second frequency of at least 100 kHz, would make it possible already to determine material characteristics provided that its dimensions are known. Conversely, the dimensions of a feature can be determined according to refence measurements and/or benchmarked models if the material from which it is constituted is known. This is typically the case for semiconductor manufacturing applications As the change in magnetic field strength is also determined by other circumstances, such as the dimensions of a material feature it is preferred to perform the measurements for a larger plurality of different frequencies. The contribution of Eddy currents in the material to the sensed magnetic field change is characterized by a monotonously increasing function of the frequency, which may be approximated as a linear relationship with the frequency. In an embodiment the at least a first frequency and a second frequency are part of a frequency sweep from a lower frequency of at most 10 kHz to a higher frequency of at least 100 kHz. In that case the magnitude of the magnetic field change can be observed during the frequency sweep to analyze various material characteristics and dimensions of features in the sample. The observed behavior of the magnitude of the magnetic field change during a lateral scan is indicative for the lateral dimensional properties of a feature in the sample. As noted above, the probe when being displaced relative to the sample may be held in continuous contact with the sample surface during scanning or the probe may be maintained close to the surface without contacting the surface.

BRIEF DESCRIPTION OF THE DRAWINGS

These and other aspects are described in more detail with reference to the drawing. Therein.

DETAILED DESCRIPTION OF EMBODIMENTS

Like reference symbols in the various drawings indicate like elements unless otherwise indicated.

Figure 1:
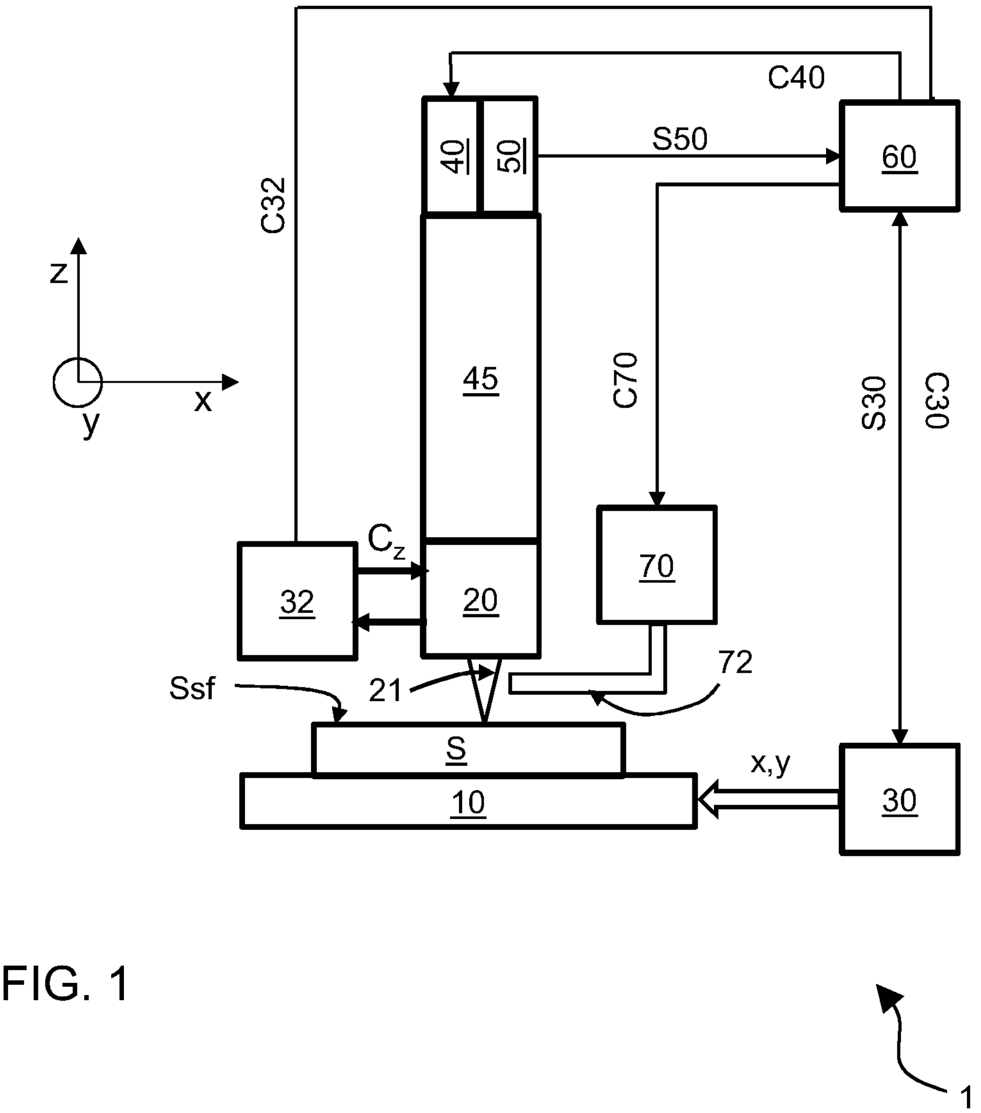
FIG. 1 schematically shows a first embodiment of a metrology device as disclosed herein.

FIG. 1 schematically shows an embodiment of a metrology device 1 as disclosed herein for determining metrological characteristics of a sample S. The metrology device 1 comprises a sample carrier 10, a probe 20, a scanning mechanism 30, an SPM controller 32, a radiation source 40 an optical sensor 50, and a signal processor 60. The sample carrier 10 is configured to carry the sample S and the scanning mechanism 30 is configured to displace the carrier 10 with the sample thereon, so as to displace the probe relative to the sample, in directions x,y along a surface of the sample. In other embodiments the scanning mechanism 30 is configured to displace the probe, or the scanning mechanism 30 is configured to displace both the carrier 10 and the probe 20 for example the carrier in a direction of the x- as and the probe in a direction of the y-axis. Typically however, the scanning mechanism is configured to displace the carrier 10 with the sample in the xy-plane and a vertical positioning mechanism is configured to position the probe 20 in a direction z, transverse to the xy-plane. Typically an area of the surface Ssf of the sample is scanned therewith, for example according to a meandering path.

The SPM controller 32 is configured to position the probe 20 in a direction z transverse to the sample S, for example to maintain the probe in contact with the surface Ssf of the sample S at a predetermined static force or to maintain the probe close above the surface Ssf for example in a shear-force mode (or oscillating with a predetermined amplitude above the sample for example in a tapping mode). The SPM controller 32 is controlled by the signal processor 60 with a signal C32 to select a particular mode of operation.

The probe 20 has a diamond tip 21 with one or more nitrogen-vacancy (NV) centers. The radiation source 40 irradiates the tip with radiation to excite the tip to emit fluorescent light. The optical sensor 50 provides a sense signal S50 indicative of an intensity of the emitted fluorescent light. A confocal imaging member 45 maps the radiation irradiated by the radiation source 40 onto the tip and maps the fluorescent light emitted by the tip onto the optical sensor 50. The signal processor 60 process the sense signal S50 to compute an extent of a feature present in the sample S.

Figure 2:
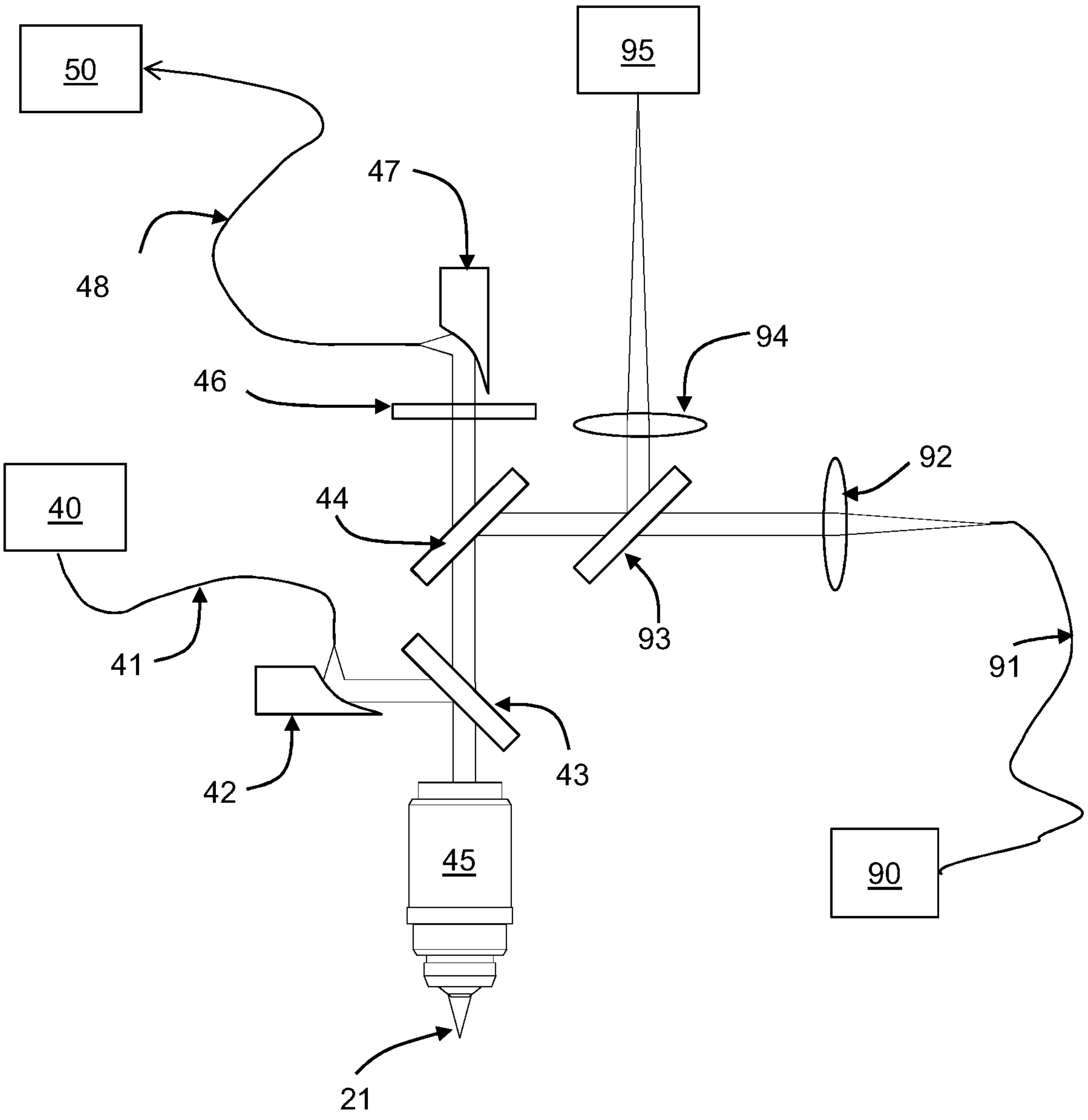
FIG. 2 shows an exemplary arrangement of optical components in the metrology device of FIG. 1.

An exemplary embodiment of the optical components of the metrology device of FIG. 1 is shown in more detail in FIG. 2. As shown therein, the radiation source 40 is coupled via an optical fiber 41, a reflective collimator 42 and a dichroic mirror 43 to the infinity corrected objective 45 which focusses the radiation onto the tip 21. Fluorescent emission emanating from the tip 21 is guided via de infinity corrected objective 45, the dichroic mirror 44, a longpass filter 46, a further reflective collimator 47 and an optical fiber 48 to the optical sensor 50. In the exemplary embodiment shown herein additional optical elements are provided to facilitate positioning and alignment. These additional optical elements comprise a LED-source 90, emitting radiation at a wavelength above 900 nm that is coupled via a liquid light guide 91, a lens 92 and beamsplitter 93 to the dichroic mirror 44. Subsequently the radiation from LED-source 90 is guided via the dichroic mirror 44, the dichroic mirror 43 to the infinity corrected objective 45 that directs the radiation emitted by LED-source 90 onto the tip 21. The light reflected back from the tip 21 or the sample is guided via the infinity corrected objective 45, the dichroic mirror 43 and the dichroic mirror 44 to the beamsplitter 93, which partially reflects the radiation to a lens 94 that maps the partially reflected radiation onto a CMOS camera 95.

Figure 3:
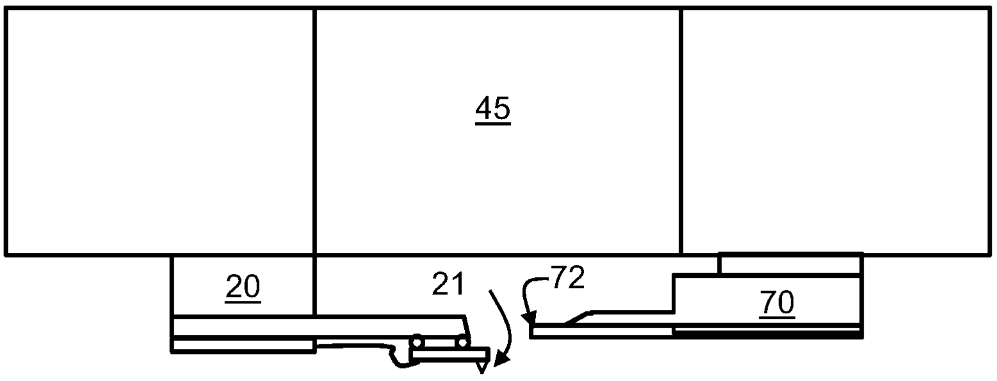
FIG. 3 shows an exemplary embodiment of a probe head for use in the metrology device of FIG. 1.

FIG. 3 shows in more detail an embodiment of a probe head carrying the probe 20 with the tip 21 and the microwave antenna 72 driven by a sweeping microwave signal generator 70. Typically, the generator 70 is provided remote from the probe head and its RF-signal is guided towards the antenna 72 using a coax cable. In the example shown the generator 70 is integrated as part of the probe head close to the antenna 72. In further examples the antenna 72 and optionally the generator 70 are integrated with the probe.

Figure 3A:
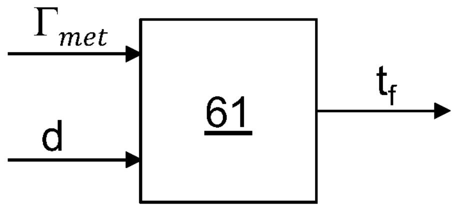
FIG. 3A, 3B shows exemplary components of a signal processor in the metrology device of FIG. 1.
Figure 3B:
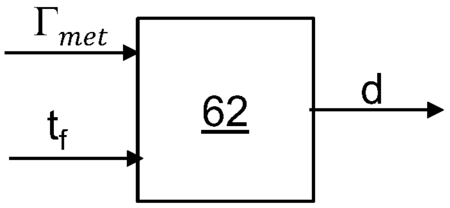

FIG. 3A and FIG. 3B show components of the signal processor 60 which will be described below in further detail.

Figure 4A:
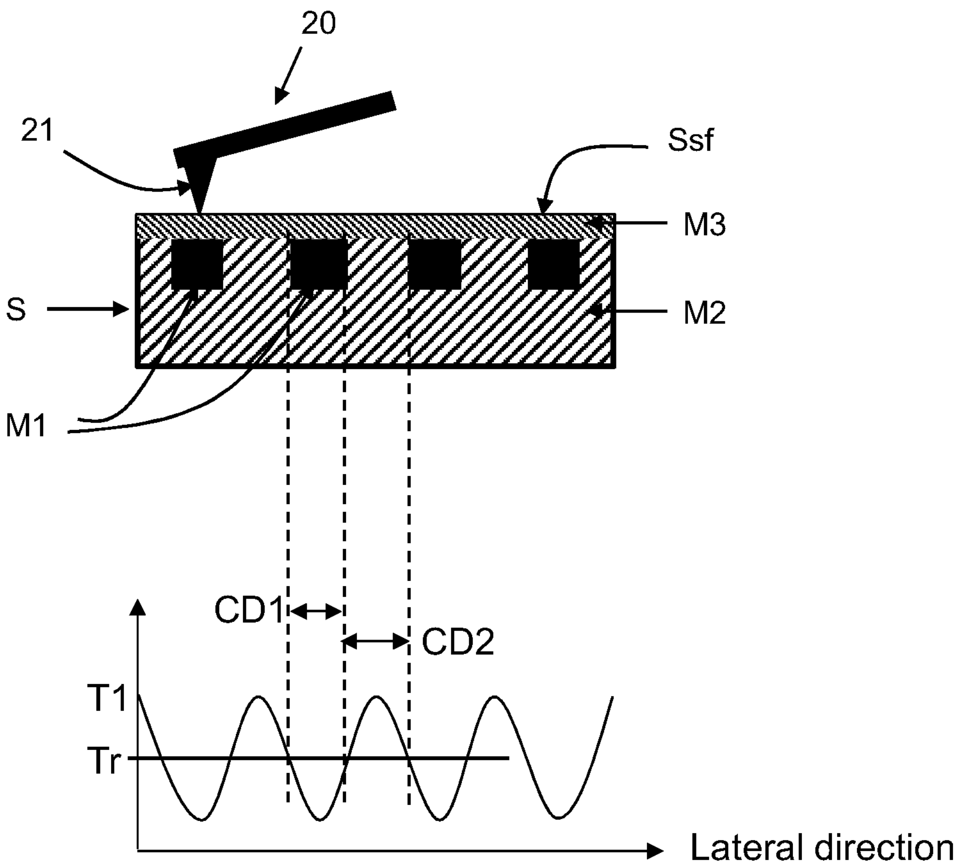
FIG. 4A, 4B shows two examples of using the metrology device of FIG. 1 for measuring feature dimensions in a sample.

FIG. 4A shows a first example of an application of the metrology device 1 of FIG. 1. Therein a sample S is provided having conductive features M1, e.g. of a metal like Co, Cu or W embedded in a layer M2 of a material or a combination of materials having a conductivity different from that of the features, for example a dielectric, such as SiO2. In the example shown, the sample S further has a surface layer M3 of a further material or a combination of materials, e.g. another dielectric like SiN. This method also serves to detect a defect or void in a sample if a non-conductive feature is identified at a location where a conductive feature is expected.

In operation, the scanning mechanism 30 (See FIG. 1) displaces the probe 20 relative to the sample S, along the surface Ssf of the sample in a lateral direction. In the example of FIG. 1 it is shown that the scanning mechanism 30 laterally displaces the sample S whereas the probe 20 is held at a fixed position. In an alternative embodiment, the scanning mechanism 30 laterally displaces the probe 20, whereas the sample S has a fixed position. In still another embodiment, the scanning mechanism 30 moves both the probe 20 and the sample S. For example a relative displacement in a first lateral direction x or y is performed by moving the sample S and a relative displacement in a direction z transverse thereto is performed by moving the probe 20. In some examples the relative displacement is according to a meandering path.

During a relative displacement in a lateral direction, e.g. in the direction x, or at mutually different relative lateral positions of the sample S and the probe 20 the following is performed.

In an embodiment, at each relative lateral position, the spin relaxation time T1 is measured. Then the signal processor 60 processes the sense signal S50 to compute a dimension of a feature present in the sample. Although various NV-based measurement approaches are available, T1 relaxometry is considered the best option as it is specifically suitable to sense the "magnetic noise" from the random movement of electrons in a metal at a few GHz. The various T1 relaxometry methods have in common that the NV center is polarized with a laser pulse (having a duration in the order of few μs). After a waiting time, another laser pulse (normally shorter) is applied to read-out the spin state of the NV center. This laser pulse excites the NV center. The resulting fluorescence is recorded and compared to the reference obtained at t=0. This procedure is repeated for several waiting times (t) to extract the relaxation time. Variations to this method can be also done, e.g. by adding a microwave pulse before readout. Small magnetic noises due to electron movements in a material will cause the NV spin to relax. The amount of spin relaxation therewith depends on the magnetic noise spectral density. i.e. the more noise, the faster the pace at which relaxation occurs. This implies that features with high conductivity (e.g. metals) will cause the spin to relax faster than features with lower conductivity (e.g. non-metals), due to their free electrons moving around and making more magnetic noise than non-conductive features.

In those regions in the lateral direction between the metal features M1, the spin relaxation time T1 is relatively large. In the regions where the metal features M1 are present, the spin relaxation time T1 drops below a reference level Tr. Therewith the signal processor 60 determines that the regions for which the spin relaxation time T1 is less than the reference level Tr as having the metal feature M1 and the regions where the spin relaxation time T1 is greater than the reference level Tr as not having the metal feature. The critical dimension CD1, i.e. the width of the metal feature, is determined as the length of the range in the lateral direction where the spin relaxation time T1 is less than the reference level Tr. The critical dimension CD2, i.e. the distance between subsequent metal features, is determined as the length of the range in the lateral direction where the spin relaxation time T1 exceeds the reference level Tr. By way of example, close to the metal features a spin relaxation time T1 in the order of 1 ms is measured, whereas in a region between subsequent metal features, the spin relaxation time is in the order of 5 ms.

Figure 4B:
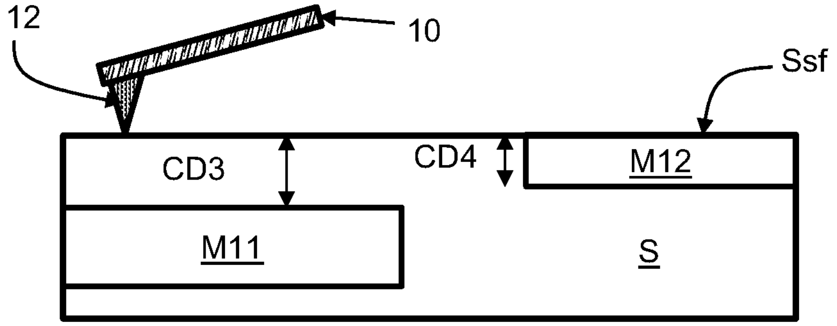

FIG. 4B shows a second example. Therein the embodiment of the metrology device 1 of FIG. 1 is used to quantitatively determine with T1 relaxometry the vertical extent of features M11, M12 having conductivity properties different from that of a substrate M2 wherein they are embedded. In the example shown in FIG. 4B a value d is determined. The value d is related to the depth CD3 of a capping material by the following relationship.

$$d = d_{nv,t} + d_{t,s} + CD3$$

Therein $d_{nv,t}$ is the distance from the NV-center to the tip, and $d_{t,s}$ is the distance from the tip to the surface of the sample.

Also it is shown in this example how the thickness $t_f$, herein denoted as CD4, of the metallic feature/film M12 over a dielectric background is determined. The relationship between the features d, $t_f$ on the hand and the relaxation rate $\Gamma_{met}$ is provided by the following expression:

$$\frac{d}{t_f}(d + t_f) = \frac{\gamma^2 \mu_0^2 k_B T \sigma}{8\pi \Gamma_{met}}$$

Therein.

$\Gamma_{met}$ is the metal-induced NV center relaxation rate

σ: is the conductivity of the metal $\mu_0$: is the vacuum permeability $k_B$: is the Boltzmann constant T: is the temperature γ: is the electron gyromagnetic ratio Provided that the depth d of a feature is known, this relationship can be used to determine the thickness $t_f$ of the feature with a component 61 (See FIG. 3A) of the signal processor 60 using the above-mentioned relationship. Provided that the thickness $t_f$ of the feature is known, the component 62 (See FIG. 3B) uses the above-mentioned relationship to compute the depth d.

In an illustrative example, the sample has lateral dimensions of 5×5 mm, and the scanning mechanism 30 provides for a scanning range of 50 μm×50 μm in the x-y plane. However any other lateral dimensions are conceivable. The same principles would apply for example when applied to a full wafer with a cross-section of 450 mm. Furthermore, the scanning range can be selected from a larger range by a manual setting. Alternatively or additionally, the scanning mechanism 30 may provide for a larger scanning range when desired. The SPM controller 32 is capable to position the probe 20 within a scanning range in the direction z of 2 μm at a bandwidth of 50 kHz to maintain the tip 21 in a contact mode or a tapping mode or at a predetermined distance to the sample dependent on a selected setting. In other examples the z-scanning range may be larger, e.g. up to 15 μm. Alternatively or additionally, the z-scanning range can be selected from a larger range by a manual setting. In the embodiment shown, the radiation source 40 is a laser having a wavelength of 515 nm and an output power of 150 mW. Output noise in the wavelength range of 250 Hz-2 MHZ (rms) is less than 0.2%. The optical sensor 50 is a photon counter having a detection efficiency over the NV emission band of 67%. The fluorescence collection efficiency from the NV center up to and before the optical sensor is about 1.7%. In a DC magnetometry operational mode the sensitivity of the metrology device is in a range of 1-10 μT/√Hz at a resolution of 10-20 nm.

It is noted that the scanning mechanism 30 may perform a relative displacement in another lateral direction, e.g. in the direction y to determine critical dimensions in that direction. Alternatively, measurement data obtained for measurements obtained from scanning in the x-direction for mutually different values can be used for that purpose.

It is further noted that various signal processing operations may be applied to the sense signal S50. For example a deconvolution operation may be applied to compensate for a pointspread function involved in the imaging method.

An alternative mode of operation of the metrology device of FIG. 1 is now described with reference to FIGS. 5A, 5B, 6A and 6B.

Figure 5A:
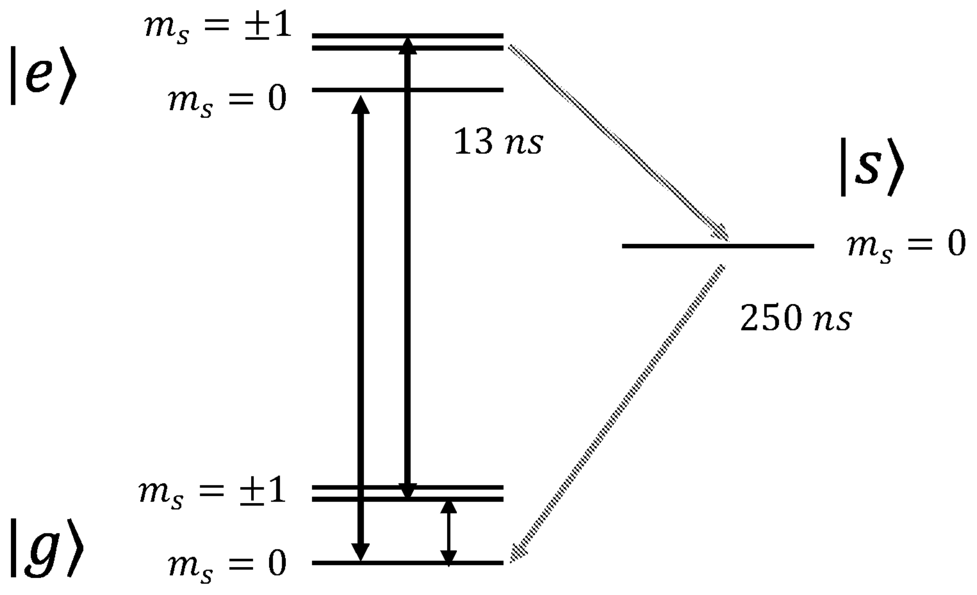
FIG. 5A and FIG. 5B show relevant physical properties of diamond NV center as applied therein in the absence of a magnetic field.

Reference is first made to FIG. 5A, wherein the main energy levels of an NV-center are shown. These comprise a zero-spin ground state |g>, ms=0 and a pair of non-zero spin ground states |g>, ms=+/−1. The corresponding excited states |e> are |e>, ms=0 and |e>, ms=+/−1. The NV-center further has a singlet state |s> at an intermediate energy level.

Upon irradiation of the NV-center with a suitable wavelength, e.g. less than 550 nm, transitions occur from the ground states to their corresponding exited states. These transitions are followed by a reverse transition to the corresponding ground state. Therewith a photon is emitted at a wavelength of about 637 nm. Instead of this reverse transition a transition may occur from an excited state to the singlet state succeeded by a transition from the singlet state to the ground state with spin 0. This sequence of transitions is more likely to occur as an alternative for the direct transition from a non-zero spin excited state than as an alternative for the direct transition from the zero spin excited state. I.e. the transition from the excited zero-spin state will almost always take place in a direct manner, i.e. as a direct transition to the zero-spin ground state. Contrary thereto, the transition from a non-zero spin excited state will in about 30% of the cases take place indirectly, via the singlet state. The indirect transition is non-radiative and therefore not detectable in the visible range.

Figure 5B:
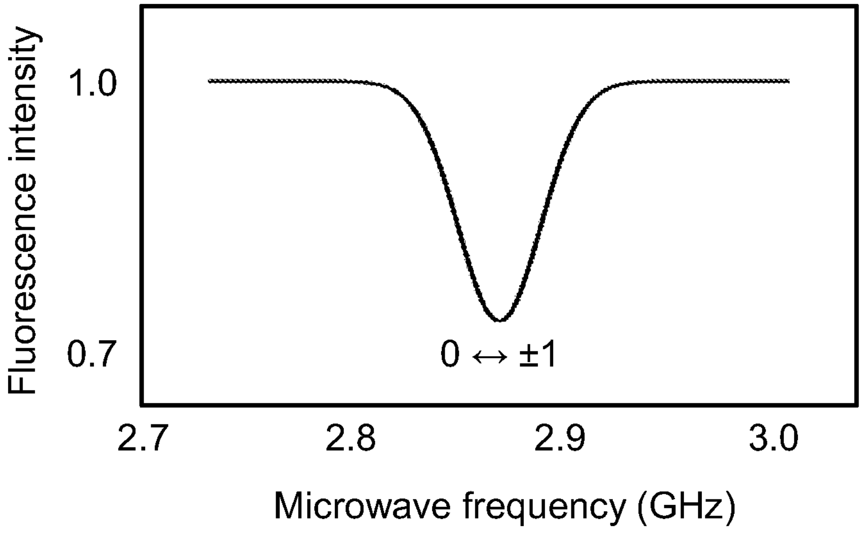

Upon subjecting the NV-center to micro-wave (MW) radiation having a frequency corresponding to the energy gap between the zero-spin ground state and a non-zero spin ground state, a transition is induced from the zero-spin ground state to the non-zero spin ground state. This also implies that the irradiation causes a transition from the non-zero spin ground state to the non-zero spin exited state. As mentioned above, starting from the non-zero spin excited state, there is a substantial probability that the reverse transition will not take place directly, but will take place via the singlet state without an emission in the visible range. This effect is illustrated in FIG. 5B, which shows a relationship of a photoluminescence intensity of an NV center and the frequency of a microwave field to which it is subjected. If the MW frequency corresponds to the energy gap between the zero-spin ground state and the non-zero spin ground state, which is a frequency of about 2870 MHz, a clear reduction of the photoluminescence intensity is visible.

Figure 6A:
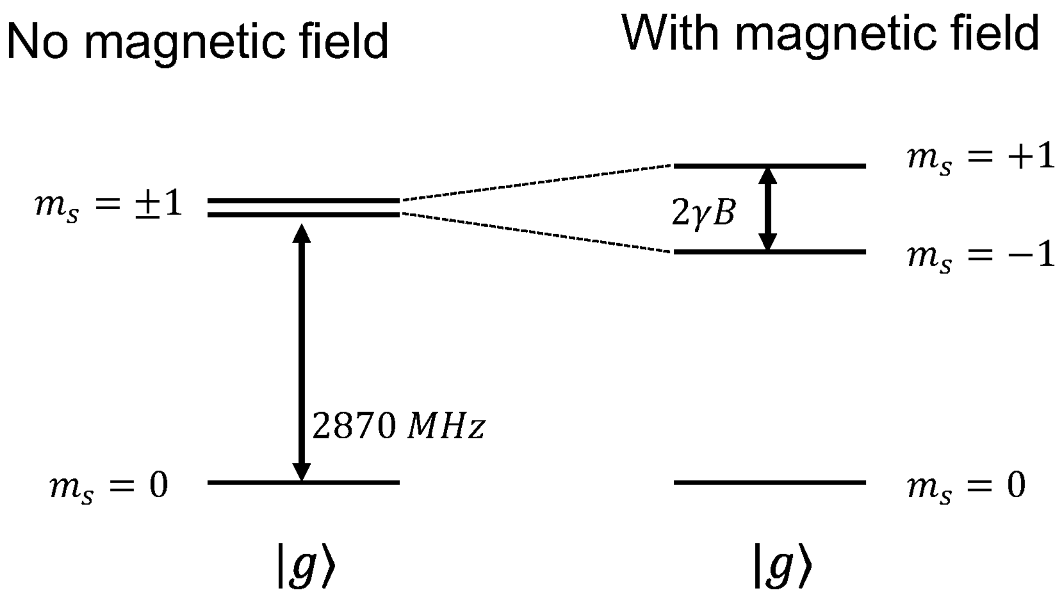
FIG. 6A and FIG. 6B show relevant physical properties of diamond NV center as applied therein in the presence of a magnetic field.

As illustrated in FIG. 6A, in the presence of a magnetic field, a split occurs in the energy levels of the non-zero spin ground states in a relatively low energy level for the negative spin ground state |g>ms=−1 and a relatively high energy level for the positive spin ground state |g>ms=+1. The difference in energy level is proportional to the magnitude B of the magnetic field. As a result, the energy gap between the zero spin ground state and the negative spin ground state |g>ms=−1 is decreased while the energy gap between the zero spin ground state and the positive spin ground state |g>ms=+1 is increased.

Figure 6B:
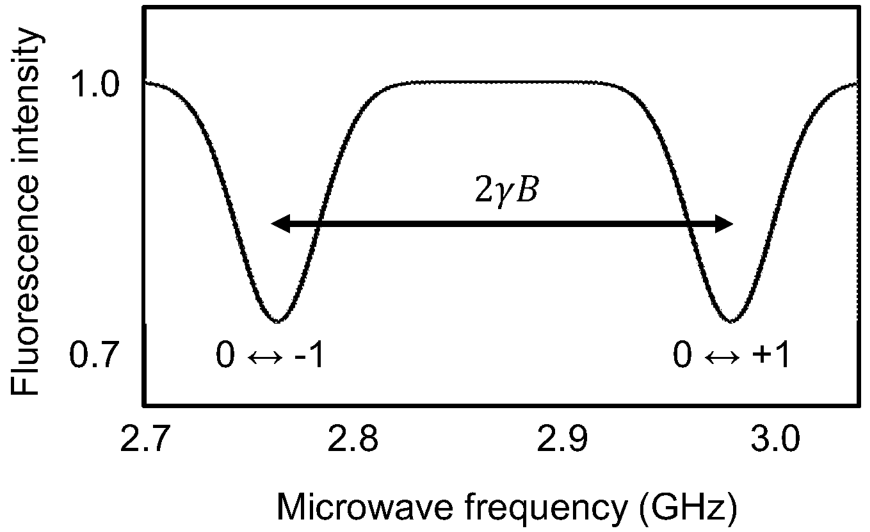

As shown in FIG. 6B, this effect is clearly visible in the photoluminescence response of the NV-center as a function of the microwave frequency. As a result of the split in energy level, the function has a first minimum for a MW-frequency corresponding to the gap between the zero spin ground state and the negative spin ground state |g>ms=−1 and a second minimum for a MW-frequency corresponding to the gap between the zero spin ground state and the positive spin ground state |g>ms=+1. As illustrated in FIG. 6B, the distance Δf between the first minimum and the second minimum is proportional to the magnitude B of the magnetic field according to the following relationship:

$$\Delta f = 2\gamma B$$

Figure 6C:
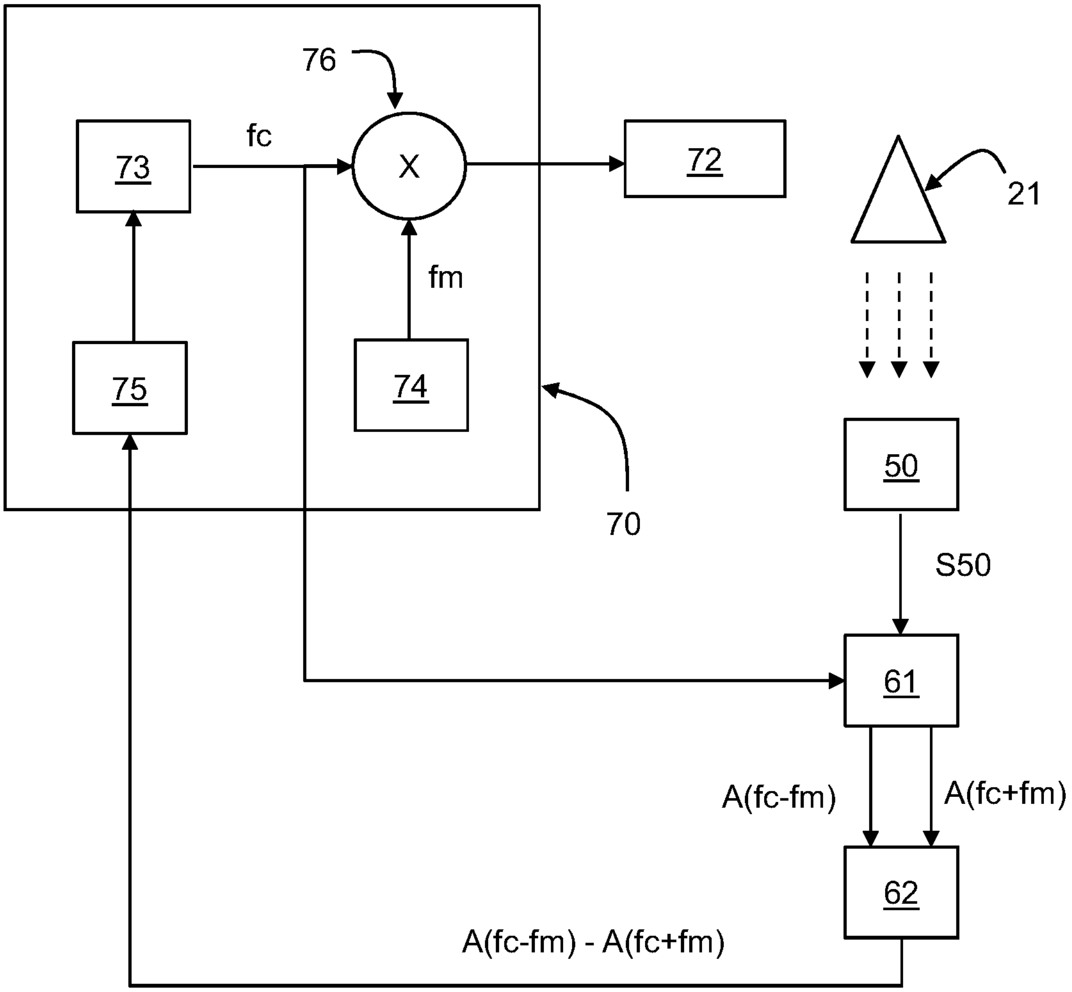
FIG. 6C shows part of an embodiment of a metrology device as disclosed herein.
Figure 6D:
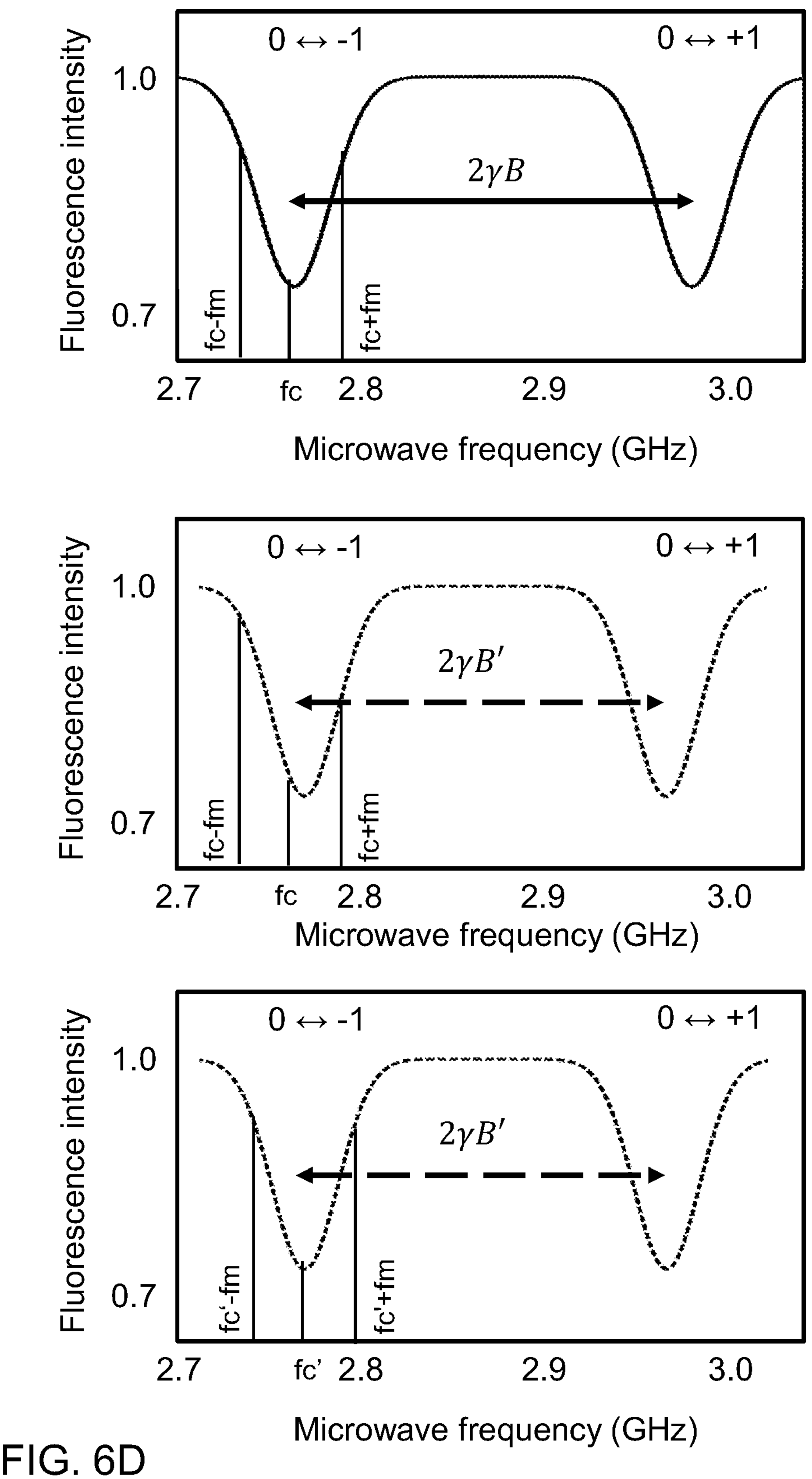
FIG. 6D illustrates an operation of the metrology device discussed with reference to FIG. 6C.

Therewith the scanning mechanism 30 displaces the probe 20 relative to the sample, along a surface of the sample, in this case by translating the sample carrier 10 in the x-y plane while the sweeping microwave signal generator 70 supplies the microwave antenna 72 with a microwave signal of varying frequency. The signal processor 60 determines at the scanned locations of the sample for which microwave frequencies a reduction in the luminance of the NV-center occurs, and therewith computes the magnetic field as a function of the position. In one embodiment the sweeping microwave signal generator 70 performs the frequency sweep in a frequency range which is exclusively at one side of the center frequency, e.g. from 2700 MHz to 2870 MHz, or from 2870 MHz to 3100 MHz. This is advantageous in that the range can be relatively modest, which may be more cost-effective. Alternatively, it may be configured to perform the frequency sweep bilaterally, e.g. in a range from 2700 to 3100 MHz, which is advantageous in that the magnitude of the magnetic field can be estimated from two measurements, i.e. the lower frequency and the higher where the photoluminescence is minimized, which contributes to an accuracy of the determination. According to another approach, the frequency of the microwave signal is maintained at a constant value, and the photoluminescence amplitude changes resulting from the local magnetic field is monitored. In this case the strength of the local magnetic field is computed from the monitored photoluminescence amplitude observed for the fixed microwave signal frequency. According to a still further approach the controller tracks the frequency at which a minimum photoluminescence response is achieved. An example thereof is shown in FIG. 6C. As shown therein the microwave signal generator 70 supplies a microwave signal to the antenna 72 having a main component with a central frequency fc and additional components with a frequency $f_{low}$ and $f_{high}$ respectively. The frequencies of the first and the second additional components are related to the central frequency as $f_{low}$=fc−Δf1 and $f_{high}$=fc+Δf2. The frequency fc is controlled so as to coincide with a minimum of the response curve as shown in FIG. 6B for example. The values Δf1, Δf2 selected such that the values fc−Δf1 and fc+Δf2 correspond to a steep part of the response curve at the left side and at the right side of the minimum respectively. The value fc is adjusted with a feedback loop that aims to maintain the difference between the response measured for fc+Δf2 and for fc−Δf1 at a constant value. By way of example Δf1=Δf2=fm. In the embodiment shown this is achieved in that the signal with frequency fc generated by controllable oscillator 73 is multiplied in element 76 by the signal with modulation frequency fm generated by oscillator 74. The detector 50 provides output signal S50 to a signal analyzer 61 that determines the amplitudes A(fc−fm) and A(fc+fm) of the signal components with frequencies fc−fm and fc+fm respectively. The difference between the amplitudes computed by subtractor 62 is used as input for the frequency controller 75, e.g. a PID controller, of the microwave signal generator 70. By way of example, FIG. 6D shows three subsequent stages of operation. The top of FIG. 6D shows an operational stage wherein the central frequency fc coincides with the first minimum of the optical response curve at about 2.76 GHz. The center part of FIG. 6D shows an operational stage in a situation wherein the magnetic field has changed from a value B to a smaller value B'. As a consequence the first minimum of the optical response curve moves to a position at a higher frequency, e.g. 2.77 GHz. As a consequence, the A(fc−fm) amplitude of the response for the sideband fc−fm increases, while at the same time the amplitude A(fc+fm) of the response for the other sideband fc+fm decreases. As a consequence, the amplitude difference A (fc−fm)−A (fc+fm) increases, in response to which the frequency controller 75 increases the value of the central frequency fc, as shown in the lower part of FIG. 6D. It is noted that in practice the frequency controller 75 will rapidly adapt the central frequency fc to minimize the amplitude difference or to maintain the amplitude difference to a predetermined reference value, in case the optical response curve is not symmetric in the neighborhood of the minimum, so that substantial deviation between the central frequency fc and the minimum of the optical response curve as shown for illustrative purposes in the middle part of FIG. 6D is avoided.

Figure 7:
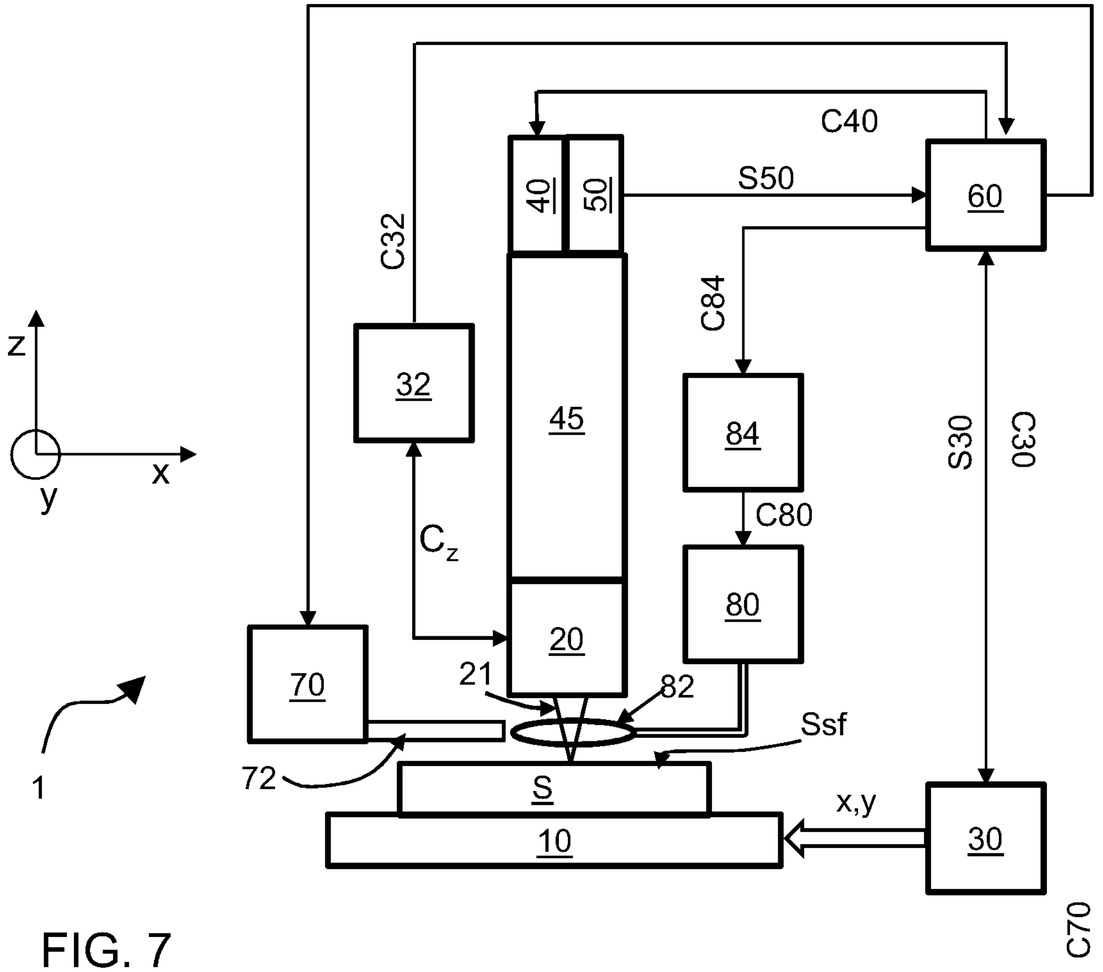
FIG. 7 shows a second embodiment of a metrology device as disclosed herein.

FIG. 7 shows another embodiment of a metrology device 1 as disclosed herein. Parts therein corresponding to those in FIG. 1 have a same reference. Also the same optical components may be used as shown in and described with reference to FIG. 2. In the embodiment shown in FIG. 7, a magnetic coil 82 is arranged near the probe 20 that is energized by a supply-current generator 80 to induce a magnetic field in the sample S. In an embodiment or operational mode the current generator provides an AC-current or a current with an AC-component so that the magnetic coil 82 induces an AC-magnetic field. Therewith Eddy currents are induced in conductive features in the sample S which in turn cause the conductive features to generate a proper magnetic field. In this embodiment, the signal processor 60 computes a strength of the magnetic field locally induced in a feature M1 of the sample at the lateral location of the tip, from the sensed photoluminescence intensity.

Figure 7A:
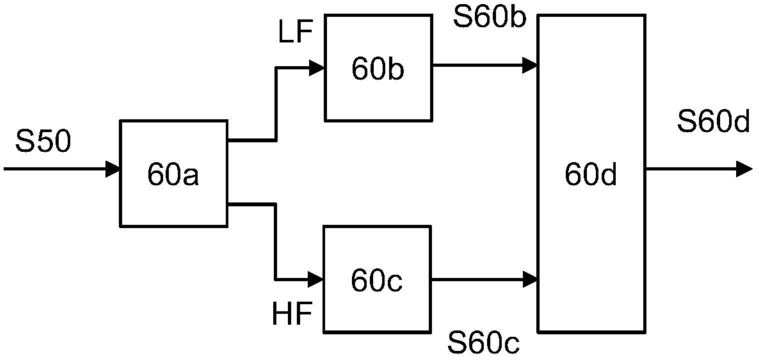
FIG. 7A shows an example of various components of a signal processor suitable for said embodiment.

FIG. 7A shows part of the signal processor 60 in a further embodiment. In signal processor section 60*a*, the sense signal S50 is split into a low-frequency component LF and a high-frequency component HF. The low-frequency component is for example a component with a frequency of 10 kHz or less, e.g. a DC component or a frequency of 10 Hz. The high-frequency component is for example a component with a frequency of 100 kHz or higher, e.g. a frequency of 100 kHz or 1 MHz. Signal processor sections 60*b* and 60*c* respectively determine the magnitude of the difference of the magnetic field as a result of a material present in the sample at the position scanned by the diamond tip. Therein the signal S60*b* indicates the magnitude of the difference determined for the low-frequency component and S60*c* indicates the magnitude of the difference determined for the high-frequency component. Signal processor section 60*d* compares the two magnitudes as indicated by the signals S60*b* and S60*c* and provides an output signal S60*d* indicative for a material identified based on the indicated magnitudes.

Figure 7B:
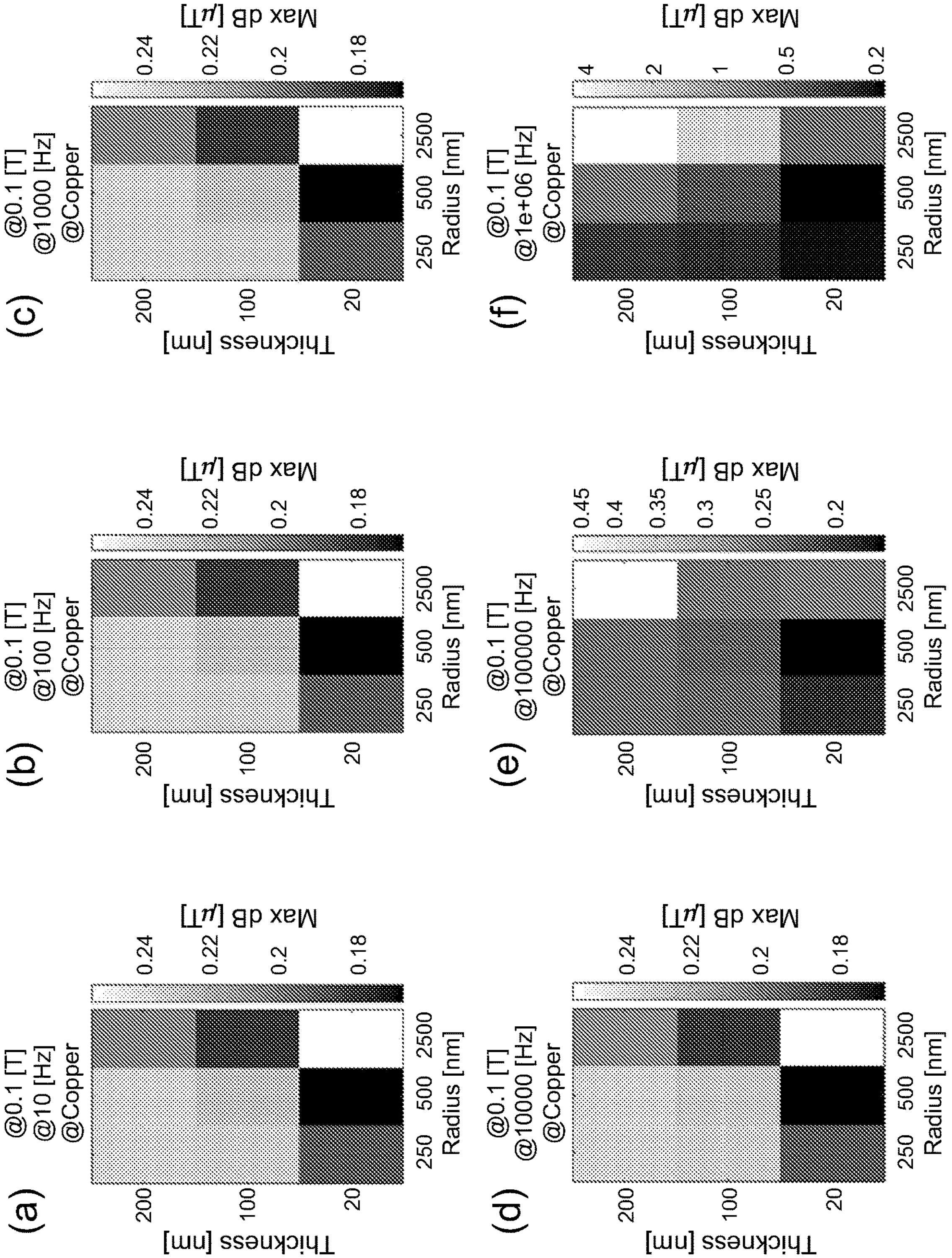
FIG. 7B shows simulation results for various samples and measurement conditions.

FIG. 7B shows simulation results wherein the change (dB) in magnetic field is computed for a scanned position near a sample of a metal disk. In each case the applied magnetic field B has a magnitude of 0.1 T. The change in magnetic field is computed for the following series of magnetic field frequencies: 10 Hz (a, g), 100 Hz (b, h), 1 kHz (c, i), 10 kHz (d, j), 100 kHz (e, k) and 1 MHz (f,l). The series of simulations were performed both for copper (a, . . . , f) and for tungsten (g, . . . , l). Also for each metal at each frequency, the effect of the radius and thickness was computed. Therewith the radius is selected from 250, 500 and 2500 nm, and the thickness is selected from 20, 100 and 200 nm.

In the simulation results for copper (a, . . . , f), it can be observed that for low frequencies the computed difference dB is in the order of magnitude of 0.2 μT. This difference is explained due to the fact that copper is diamagnetic, having a relative permeability of 0.999994. For frequencies of 100 kHz and higher the magnitude of the difference dB increases. For 100 kHz the difference dB is increased to about 0.3 μT. For a frequency of 1 MHz, the difference dB is increased to about 3 μT. This increase is explained by the Eddy current effect which monotonously increases with the frequency.

In the simulation results for tungsten (g, . . . , l), it can be observed that for low frequencies the computed difference dB is in the order of magnitude of 2.2 μT. This difference is explained due to the fact that tungsten is paramagnetic, having a relative permeability of 1.000068. Also for high frequencies an increase of the difference dB is observed, but this increase is less prominent than for copper. For a frequency of 1 MHz, in the case of the tungsten disk of radius 2500 nm and thickness of 100 nm the difference dB increases from about 2.3 to about 2.4 μT. This is due to the fact that tungsten, due to its larger relative permeability as compared to copper already causes a relatively high change dB in the magnetic field and to the fact that the conductivity of tungsten is only about 0.3 times that of copper.

From the simulations it is apparent that the sample characterization device with the signal processing device of FIG. 7A is capable to identify the nature of the material in the sample by analyzing the magnetic field differences sensed with the tip for at least two different frequencies of the source magnetic field generated with the coil 82.

As another example wherein the material used in a feature is known, a detected deviation between the response as measured and the expected response can be used as an indication for a possible defect of the feature. For example reference measurement data may be available for conductive interconnects, and a detected deviation of measurement data of a specific interconnect in the sample is indicative for a defect or a void within that specific interconnect. The magnitude of the deviation may further be indicative for the size of the defect or the void.

Figure 8:
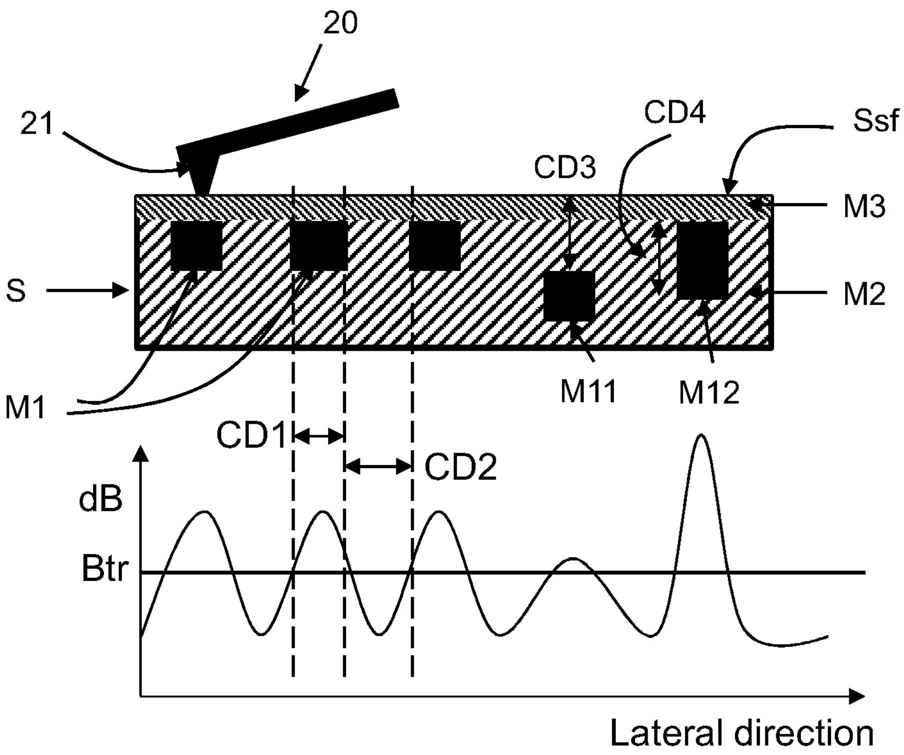
FIG. 8 shows an exemplary application of the metrology device of FIG. 7 for measuring feature dimensions in a sample.

As another example, which is demonstrated with reference to FIG. 8 it is possible to apply the method for metrology purposes. By way of example FIG. 8 shows qualitatively how a measured change of the magnetic field dB, is a function of metrological data such as the lateral size and/or position, the depth and the thickness of features in a sample. It can be observed therein that the change in magnetic field is clearly different at locations where a feature M1 is present as compared to the intensity at locations between features.

As a first example it is shown that the critical dimension CD1, i.e. the lateral size of a conductive feature M1 is determined as the distance in the lateral direction for which the measured value dB exceeds a threshold value Btr.

As a second example it is shown that the critical dimension CD2, i.e. the lateral distance between successive conductive feature M1 is determined as the distance in the lateral direction for which the measured value dB is less than a threshold value Btr.

Figure 8A:
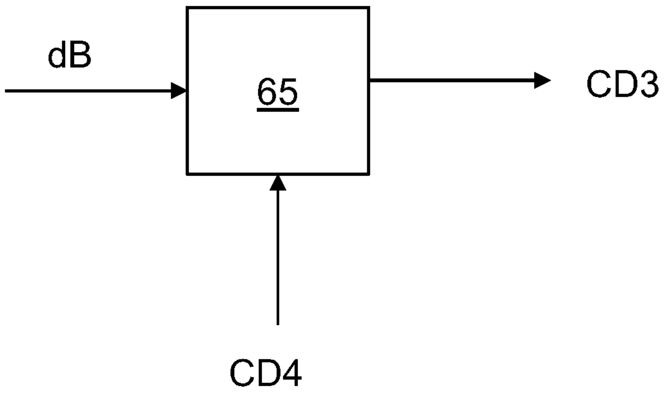
FIG. 8A, 8B show exemplary components in a further embodiment of a metrology device.

FIG. 8 shows further for the purpose of a third example that the extent to which dB exceeds the threshold value Btr is dependent on the depth (CD3) of a conductive feature e.g. M11 and the thickness (CD4) of a conductive feature, e.g. M12. The value dB measured for a conductive feature is a decreasing function of its depth CD3 and is an increasing function of its thickness CD4. This renders it possible to determine a depth CD3 of the feature M11, provided that its thickness CD4 is known. This is specially relevant when the conductive features M11 or M12 are extended layers or thin films of conductive materials. As shown in FIG. 8A, circuit component 65 determines the depth value for CD3 for a conductive feature M11 having the known thickness and for which the expected value of the change of the magnetic field dB is equal to the measured value of the change of the magnetic field dB. The relationship between the expected value of the change of the magnetic field dB and the depth value for CD3 is for example expressed as a polynomial function or as a lookup table. The polynomial function or the lookup table is for example constructed from values of dB that are determined by simulation, computation or measurement for conductive features with corresponding lateral sizes but various values for CD3 and CD4.

Figure 8B:
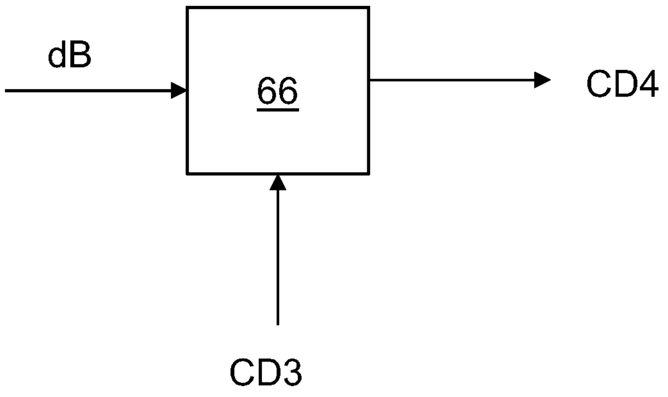

Analogously, in a fourth example shown in FIG. 8B, circuit component 66 determines the thickness CD4 of a conductive feature M12 at a known depth CD3 to be the thickness value CD4 for a conductive feature at the known depth and for which the expected value of the change of the magnetic field dB is equal to the measured value of the change of the magnetic field dB.

It is noted that metrology can be performed alternatively on the basis of a measurement of the relaxation time. As demonstrated above with reference to FIG. 4A the critical dimension CD1 of a conductive feature (M1) in a lateral direction can be alternatively determined as the distance in that lateral direction for which the measured relaxation time T1 assumes a value lower than a predetermined relaxation time threshold value Tr.

Similarly, as further demonstrated above with reference to FIG. 4A, the critical dimension CD2 in a lateral direction can be determined as the distance in that lateral direction for which the measured relaxation time T1 exceeds a predetermined relaxation time threshold value Tr.

Further, as an alternative of the third example the depth CD3 of a conductive feature M11 having a known thickness CD4 is determined to be the depth value for CD3 for a conductive feature having the known dimensions and for which the expected value of the relaxation time T1 is equal to the measured value of the relaxation time.

Analogously, as an alternative for the fourth example, the thickness CD4 of a conductive feature (M12) at a known depth CD3 is determined to be the thickness value for CD4 for a conductive feature at the known depth and for which the expected value of the relaxation time T1 for the corresponding lateral dimension is equal to the measured value of the relaxation time T1.

In a still further example, the inventive metrology device is configured to detect a void or defect in a conductive feature. In one embodiment it is configured for this purpose by determining that the detected relaxation time deviates from a reference value for said conductive feature. In another embodiment it is configured for this purpose by determining that the detected magnetic field deviates from a reference value for said conductive feature. In a still further embodiment it is configured to detect a void or defect by using both input data indicative for a deviation of a detected relaxation time and input data indicative for a deviation of a detected magnetic field.

In again another example the inventive metrology device is configured to detect a deviation of a material property of a conductive feature. In one embodiment it is configured for this purpose by determining that the detected relaxation time deviates from a reference value for said conductive feature. In another embodiment it is configured for this purpose by determining that the detected magnetic field deviates from a reference value for said conductive feature. In a still further embodiment it is configured to detect a deviation of a material property of a conductive feature by using both input data indicative for a deviation of a detected relaxation time and input data indicative for a deviation of a detected magnetic field.

While the present invention has been described with respect to a limited number of embodiments, those skilled in the art will appreciate numerous modifications and variations therefrom within the scope of this present invention as determined by the appended claims

The invention claimed is:

1. A metrology device for determining metrological characteristics of a sample with conductive features embedded in a layer of a material or a combination of materials having a conductivity different from that of the conductive features, the device comprising:

a probe having a diamond tip with one or more nitrogen-vacancy centers;

a scanning mechanism to displace the probe relative to the sample, along a surface of the sample;

a radiation source to irradiate the diamond tip with a photon radiation to excite the diamond tip to emit fluorescent light;

an optical sensor to provide a sense signal indicative of an intensity of fluorescent light emitted by the diamond tip;

a signal processor to process the sense signal to compute at least one characteristic of a conductive feature present in the sample, a magnetic coil;

a current generator to supply the magnetic coil with supply-current to induce an magnetic field in the sample; and a frequency control unit to control an operational frequency of the current generator, wherein the frequency control unit is configured to subsequently select mutually different operational frequencies to perform a frequency sweep or to cause the current generator to generate a supply current having at least a first component and a second component of mutually different frequency, and wherein the signal processor comprises signal processor components to determine respective changes in a magnetic field for a lateral position near the surface of the sample resulting from a source magnetic field for respective mutually different magnetic field frequencies, and to determine material properties of a material at the lateral position in the sample from the determined respective changes.

2. The metrology device according to claim 1, which is configured to:

measure a spin relaxation time and to determine a first critical dimension of a conductive feature in the sample in a lateral direction as a distance in a lateral direction for which the measured spin relaxation time assumes a value lower than a predetermined relaxation time threshold value; or induce a magnetic field and to determine a first critical dimension of a conductive feature in the sample in a lateral direction as a distance in a lateral direction for which a measured value of a change of the magnetic field relative to the induced magnetic field exceeds a threshold value.

3. The metrology device according to claim 1, which is configured to:

measure a spin relaxation time and to determine a second critical dimension for a distance between subsequent conductive features in the sample in a lateral direction as a distance in a lateral direction for which the measured spin relaxation time assumes a value that exceeds a predetermined relaxation time threshold value; or induce a magnetic field and to determine a second critical dimension for a distance between subsequent conductive features in the sample in a lateral direction as a distance in a lateral direction for which a measured value of a change of the magnetic field relative to the induced magnetic field is less than a threshold value.

4. The metrology device according to claim 1, which is configured to:

measure a spin relaxation time and to determine a depth of a conductive feature, in the sample, having a known thickness to be a depth value for the depth of the conductive feature for the conductive feature having the known thickness and for which an expected value of the spin relaxation time is equal to the measured spin relaxation time; or induce a magnetic field and to determine a depth of a conductive feature, in the sample, having a known thickness to be a depth value for the depth of the conductive feature for the conductive feature having the known thickness and for which an expected value of the change of the magnetic field relative to the induced magnetic field is equal to the measured value of the change of the magnetic field relative to the induced magnetic field.

5. The metrology device according to claim 1, which is configured to:

measure a spin relaxation time and to determine a thickness of a conductive feature in the sample at a known depth to be a thickness value for the thickness of the conductive feature for a conductive feature at the known depth and for which an expected value of the spin relaxation time is equal to the measured value of the spin relaxation time; or induce a magnetic field and to determine the thickness of a conductive feature in the sample at a known depth to be a thickness value for the thickness of the conductive feature for a conductive feature at the known depth and for which the expected value of the change of the magnetic field relative to the induced magnetic field is equal to the measured value of the change of the magnetic field relative to the induced magnetic field.

6. The metrology device according to claim 1, configured to detect a void or defect in a conductive feature in the sample by:

determining that a detected spin relaxation time deviates from a reference value for the conductive feature; or inducing a magnetic field and determining that a detected magnetic field deviates from a reference value for the conductive feature.

7. The metrology device according to claim 1, configured to detect a deviation of a material property of a conductive feature in the sample by:

determining that a detected relaxation time deviates from a reference value for the conductive feature; or inducing a magnetic field and determining that the detected magnetic field deviates from a reference value for the conductive feature.

8. The metrology device according to claim 1, comprising:

a microwave antenna arranged near the diamond tip; and a microwave signal generator to supply the microwave antenna with a microwave signal.

9. The metrology device according to claim 1, further comprising a permanent magnet to provide a background magnetic field in the diamond tip.

10. The metrology device according to claim 2, which is configured to:

measure a spin relaxation time and to determine a second critical dimension for a distance between subsequent conductive features in the sample in a lateral direction as a distance in a lateral direction for which the measured spin relaxation time assumes a value that exceeds a predetermined relaxation time threshold value; or induce a magnetic field and to determine a second critical dimension for a distance between subsequent conductive features in the sample in a lateral direction as a distance in a lateral direction for which a measured value of a change of the magnetic field relative to the induced magnetic field is less than a threshold value.

11. The metrology device according to claim 2, which is configured to:

measure a spin relaxation time and to determine a depth of a conductive feature, in the sample, having a known thickness to be a depth value for the depth of the conductive feature for the conductive feature having the known thickness and for which an expected value of the spin relaxation time is equal to the measured spin relaxation time; or induce a magnetic field and to determine a depth of a conductive feature, in the sample, having a known thickness to be a depth value for the depth of the conductive feature for the conductive feature having the known thickness and for which an expected value of the change of the magnetic field relative to the induced magnetic field is equal to the measured value of the change of the magnetic field relative to the induced magnetic field.

12. The metrology device according to claim 2, which is configured to:

measure a spin relaxation time and to determine a thickness of a conductive feature in the sample at a known depth to be a thickness value for the thickness of the conductive feature for a conductive feature at the known depth and for which an expected value of the spin relaxation time is equal to the measured value of the spin relaxation time; or induce a magnetic field and to determine the thickness of a conductive feature in the sample at a known depth to be a thickness value for the thickness of the conductive feature for a conductive feature at the known depth and for which the expected value of the change of the magnetic field relative to the induced magnetic field is equal to the measured value of the change of the magnetic field relative to the induced magnetic field.

13. The metrology device according to claim 3, which is configured to:

measure a spin relaxation time and to determine a depth of a conductive feature, in the sample, having a known thickness to be a depth value for the depth of the conductive feature for the conductive feature having the known thickness and for which an expected value of the spin relaxation time is equal to the measured spin relaxation time; or induce a magnetic field and to determine a depth of a conductive feature, in the sample, having a known thickness to be a depth value for the depth of the conductive feature for the conductive feature having the known thickness and for which an expected value of the change of the magnetic field relative to the induced magnetic field is equal to the measured value of the change of the magnetic field relative to the induced magnetic field.

14. The metrology device according to claim 3, which is configured to:

measure a spin relaxation time and to determine a thickness of a conductive feature in the sample at a known depth to be a thickness value for the thickness of the conductive feature for a conductive feature at the known depth and for which an expected value of the spin relaxation time is equal to the measured value of the spin relaxation time; or induce a magnetic field and to determine the thickness of a conductive feature in the sample at a known depth to be a thickness value for the thickness of the conductive feature for a conductive feature at the known depth and for which the expected value of the change of the magnetic field relative to the induced magnetic field is equal to the measured value of the change of the magnetic field relative to the induced magnetic field.

15. The metrology device according to claim 4, which is configured to:

measure a spin relaxation time and to determine a thickness of a conductive feature in the sample at a known depth to be a thickness value for the thickness of the conductive feature for a conductive feature at the known depth and for which an expected value of the spin relaxation time is equal to the measured value of the spin relaxation time; or induce a magnetic field and to determine the thickness of a conductive feature in the sample at a known depth to be a thickness value for the thickness of the conductive feature for a conductive feature at the known depth and for which the expected value of the change of the magnetic field relative to the induced magnetic field is equal to the measured value of the change of the magnetic field relative to the induced magnetic field.

16. The metrology device according to claim 2, comprising:

a microwave antenna arranged near the diamond tip; and a microwave signal generator to supply the microwave antenna with a microwave signal.

17. A metrology device for determining metrological characteristics of a sample with conductive features embedded in a layer of a material or a combination of materials having a conductivity different from that of the conductive features, the device comprising:

a probe having a diamond tip with one or more nitrogen-vacancy centers;

a scanning mechanism to displace the probe relative to the sample, along a surface of the sample;

a radiation source to irradiate the diamond tip with a photon radiation to excite the diamond tip to emit fluorescent light;

an optical sensor to provide a sense signal indicative of an intensity of fluorescent light emitted by the diamond tip;

a signal processor to process the sense signal to compute at least one characteristic of a conductive feature present in the sample, a magnetic coil and a current generator to supply the magnetic coil with supply-current to induce an magnetic field in the sample; and a frequency control unit to control an operational frequency of the current generator, wherein the frequency control unit is configured to select mutually different operational frequencies to perform a frequency sweep or to cause the current generator to generate a supply current having at least a first component and a second component of mutually different frequency, wherein the signal processor comprises signal processor components to:

determine respective changes in a magnetic field for a lateral position near the surface of the sample resulting from a source magnetic field for respective mutually different magnetic field frequencies, and determine material properties of a material at the lateral position of the sample from the determined changes, and wherein the metrology device is configured to:

measure a spin relaxation time and to determine a critical dimension of a conductive feature in the sample in a lateral direction as the distance in that lateral direction for which the measured spin relaxation time assumes a value lower than a predetermined relaxation time threshold value; or induce a magnetic field and to determine the critical dimension of the conductive feature as the distance in that lateral direction for which the measured value of a change of the magnetic field relative to the induced magnetic field exceeds a threshold value.

18. The metrology device according to claim 17, further comprising a permanent magnet to provide a background magnetic field in the diamond tip.

* * * * *